(12) United States Patent
Clark et al.

(10) Patent No.: US 6,282,139 B1
(45) Date of Patent: Aug. 28, 2001

(54) REGISTER FILE WITH IMPROVED NOISE IMMUNITY AND ASPECT RATIO

(75) Inventors: Lawrence T. Clark; E. J. N. Tsangaris, both of Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/444,538

(22) Filed: Nov. 22, 1999

(51) Int. Cl.$^7$ .................................................. G11C 8/00
(52) U.S. Cl. ................... 365/230.01; 365/230.06
(58) Field of Search ................ 365/230.04, 230.09, 365/239, 230.06, 230.01

(56) References Cited

U.S. PATENT DOCUMENTS 5,392,411 * 2/1995 Ozaki ................................... 395/400
5,978,904 * 11/1999 Matsuo et al. ...................... 712/233

* cited by examiner

Primary Examiner—David Nelms
Assistant Examiner—Thong Le
(74) Attorney, Agent, or Firm—Blakely, Sokoloff, Taylor & Zafman LLP

(57) ABSTRACT

A register file with a plurality of memory cells arranged such that a single word line enable signal path is coupled to word pairs formed from the memory cells, and a logic circuit which is configured to enable separate access of each word of the word pairs.

18 Claims, 4 Drawing Sheets

REGISTER FILE WITH IMPROVED NOISE IMMUNITY AND ASPECT RATIO

BACKGROUND OF THE INVENTION

I. Field of the Invention

The present invention relates to the general field of electronic circuits. More specifically the present invention relates to electronic memories.

II. Background Information

Most large digital chips such as modern microprocessors require register files for fast access to data. As the number of ports and word width in the chip increases, and as metal interconnect layers scale down in size and distance to the driving transistors increases, the distance between wordlines decreases. A decrease in the distance between wordlines causes the capacitance between wordlines to increase. The increased capacitance of wordlines contributes to reduction in the noise immunity of the register file as may be understood from the following description presented in connection with FIG. 1.

FIG. 1 illustrates a plurality of wordlines 102, 104 and 106 of a register file. Metal lines 102, 104 and 106 have a line-to-line capacitance CLL there between. This capacitance dramatically increases when lines 102, 104 and 106 get very close to each other. In sub-micron integrated circuits, the distance between wordlines has scaled below ½ μm. As the width of the memory increases, e.g., while data paths grow from 32 to 64 bits or as parts are added to the design, the distance to the driving transistors increases, effectively shielding the driver strength by increasing line resistance.

Assume that wordlines 102 and 106 go high in an upward transition of the signals therethrough from 0 to 1, while wordline 104 is supposed to stay low. Due to the line-to-line capacitance CLL, wordline 104 may charge up to a value that may exceed the threshold voltage $V_t$ of a transistor coupled to this line thereby causing that transistor to erroneously turn on. This would correspond to transistor 212 in FIG. 2 turning on and allowing an erroneous read current to be placed on bitline 206. As a consequence, a circuit connected to the wordline 104 may read at a time when it is not supposed to do so. Another problem with modern integrated circuits is that the threshold voltage $V_t$ has been decreasing over time, in part, due to the reduction in the size (sub-micron size) of the features in these circuits at the same time that the coupling is increasing. This makes the problem related to noise immunity worse.

SUMMARY OF THE INVENTION

A register file with a plurality of memory cells arranged such that a single word line enable signal path is coupled to word pairs formed from the memory cells, and a logic circuit which is configured to enable separate access of each word of the word pairs.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
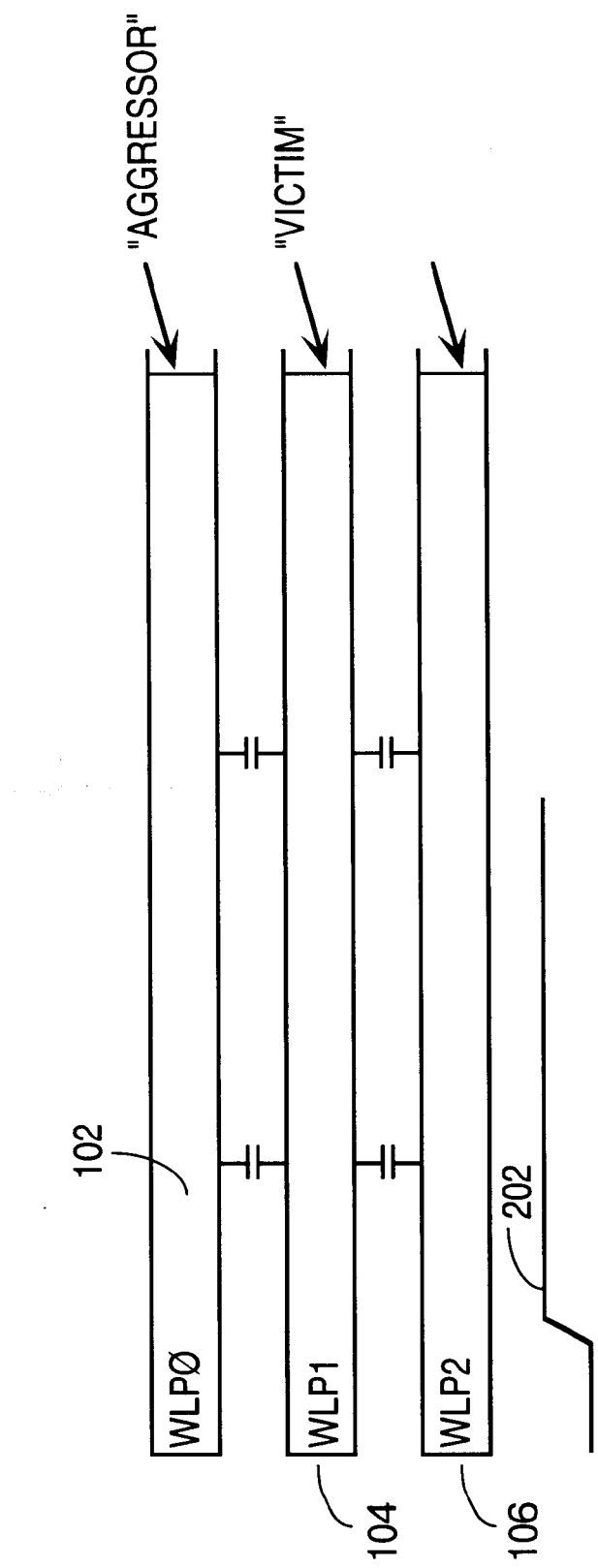
FIG. 1 illustrates a plurality of wordlines of a register file.
Figure 2:
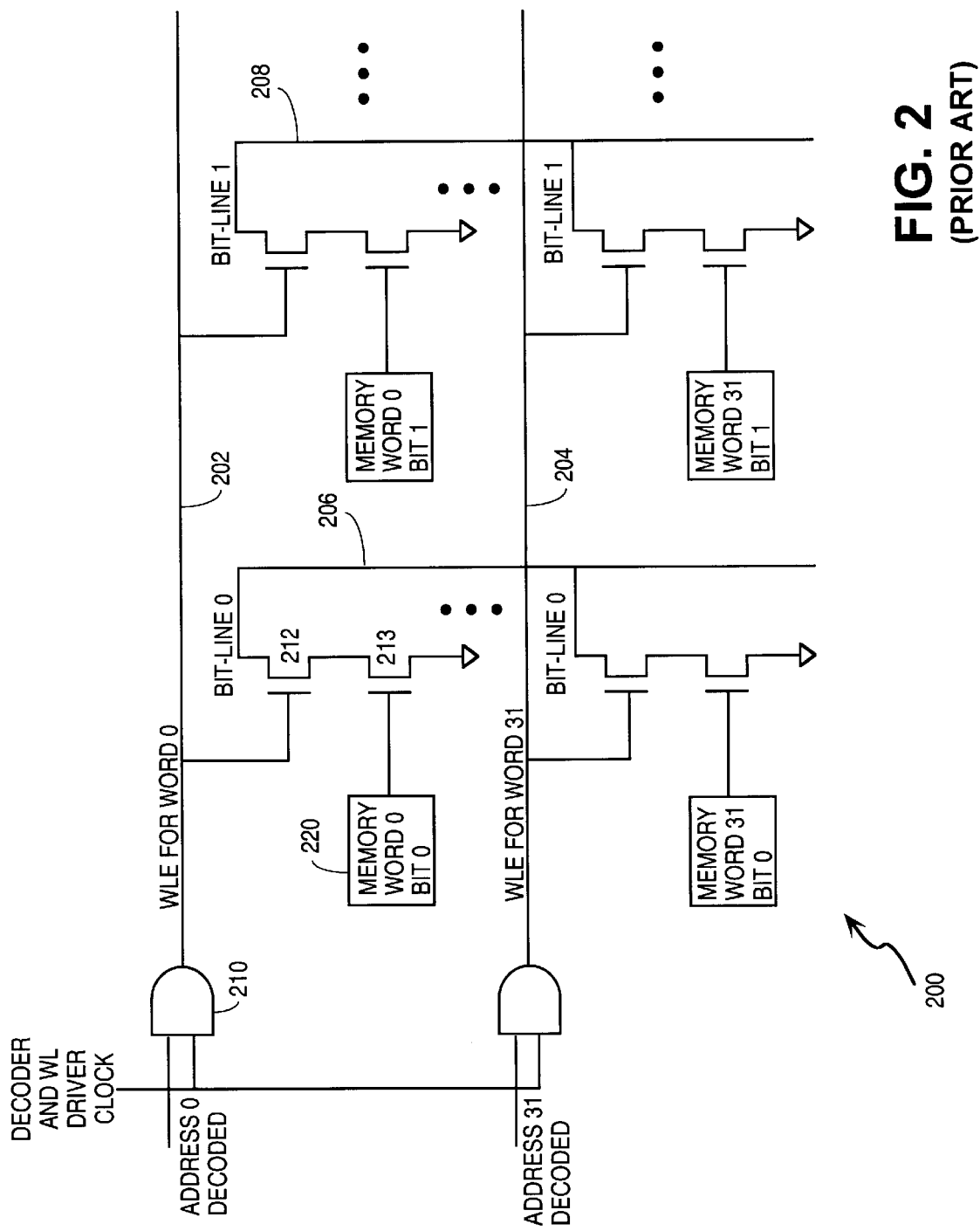
FIG. 2 illustrates a conventional register file circuit.

FIG. 2 illustrates a conventional register file circuit 200. Register file 200 includes a plurality of wordlines 202, 204, etc. that are coupled to a plurality of bit lines 206, 208, etc. of the array. The embodiment of the register file 200 has 32 wordlines, of which only wordlines 0 and 31 are shown for simplification. For each wordline there is an addressing logic 210 that selects a respective wordline of the array for reading. In one embodiment, the addressing logic includes an AND gate 210 that receives at an input thereof, a decoded address of the respective wordline and at a second input thereof, a clock signal. The clock signal sequences the assertion of the wordline signal to wordline 202.

Circuit 200 is a circuit that has all the bitlines of the array 206, 208, etc., pre-charged. For brevity, the pre-charge circuit is not shown. It may be as simple as a single PMOS transistor connected to the bitline as is well known in the art. To read a memory cell, say the memory cell 220 that is on wordline 202, wordline 202 is asserted. As a result, transistor 212 is turned on. Depending on what logic value is stored in the memory cell 220, bitline 206 may be discharged, or may remain charged at the same voltage. For example, in the case where a logic "one" is stored in memory cell 220, bitline 206 gets discharged as the logic "one" stored in memory cell 220 turns on transistor 213 that pulls down the voltage on bitline 206. If memory cell 220 has a logic "zero" stored thereon, bitline 206 remains charged as transistor 213 is not conducting. In a similar fashion data may be read out from the memory cells coupled to wordline 204. The readout circuit is essentially a domino "nand" gate with one input comprised of the wordline and one input the cell memory value.

The register file 200, however, is prone to errors in reading caused by noise due to neighboring wordlines. As explained earlier, when the wordlines are placed very close to each other, the line-to-line capacitance becomes higher and neighboring wordlines that are asserted may cause charging of adjacent wordlines. Therefore, due to noise, wordlines that are not asserted may however be charged to voltage levels that may exceed the threshold voltage $V_t$ for the transistors coupled to these wordlines causing an erroneous read operation to the wordlines that are not asserted. Essentially, since the read circuit is a domino type, which have a low noise immunity due to their low switching threshold, the conventional circuit suffers increasing noise risk.

Figure 3:
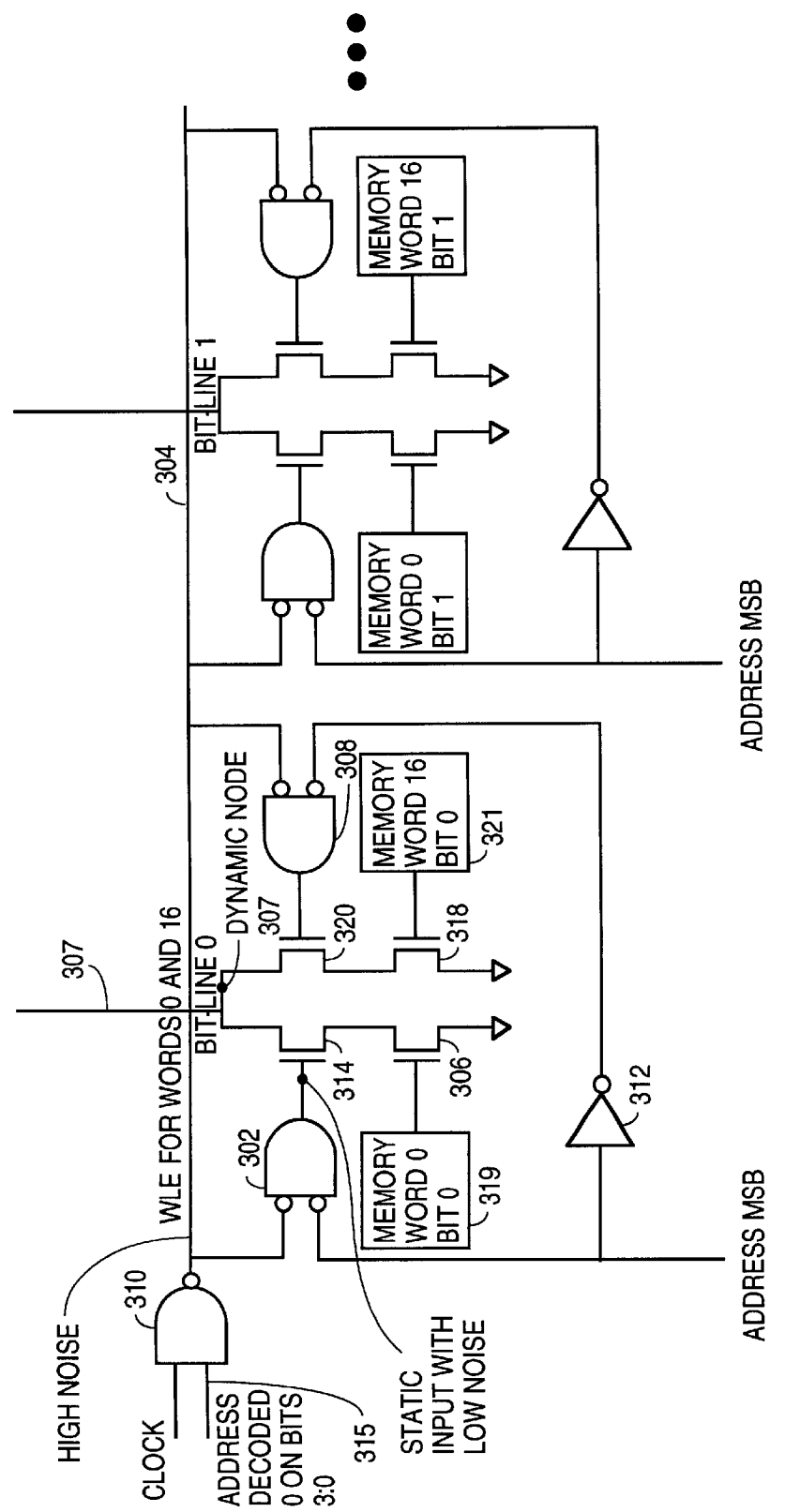
FIG. 3 illustrates register file with improved noise immunity according to one embodiment of the present invention.

FIG. 3 illustrates register file 300 with improved noise immunity according to one embodiment of the present invention. Register file 300 is designed to accommodate the same number of memory cells as the register file 200. However register file 300 has fewer wordlines per area of die when the same size of die is utilized for both register files 200 and 300. The distance between the wordlines on the die in register file 300 is increased to reduce the high line-to-line capacitance otherwise present in the conventional register file 200. For each of two wordlines of register file 200 of FIG. 2 that have addresses where the least significant bits of these addresses have identical logic values but the logic values of the most significant bit differ, register file 300 uses a "shared" wordline such as wordline 304. For example, wordline addresses 0 and 16 are represented as "00000" and "10000". The least significant bits, i.e., bits 3:0 of these binary addresses are set for both addresses to the same logic value 0, while the most significant bit for each of these wordline addresses differ. The most significant bit for wordline address 0 is "0" while the most significant bit for wordline address 16 is "1." Similarly, the rest of the register wordlines may be coalesced into one shared wordline under the same principle that applies to wordline 0 and 16. Thus, as fewer wordlines are required, they may be spaced further apart, additionally lowering the capacitance component and consequent noise.

For purposes of providing access, at one time, to only one of the two memory cells coupled to wordline 304, register file 300 includes a mechanism that distinguishes between the addresses of the two wordlines, say wordline 0 and 16 in the example provided above, that have been coalesced into one shared wordline. The distinction between these two coalesced wordlines is based on the most significant bit (or another bit) of the addresses of these wordlines. Register file 300 includes separate access logic circuits to separately access the memory cells 319 and 321 associated with the two coalesced wordlines 0 and 16. The access logic circuits include static gates 302 and 308 respectively. These static gates improve the noise immunity. Static gates have a higher noise immunity than dynamic gates. While the latter has the logic threshold set to Vtn, which affords poor noise immunity, a static gate has a higher noise immunity which is a function of the transistor geometries and is thus configurable by the designer.

This allows the wordline signals to be routed at minimum spacing with less effect from coupled noise into the cell, which in turn, allows for more cells in a given data-path pitch, or more ports, i.e., improved layout aspect-ratio.

Additionally, the low going wordline assertion makes for a better (falling) enable edge rate, as NMOS transistors tend to be much faster than their PMOS counter parts. Typical wordline driver to cell looks like FIG. 2, where the large load wordline enable (WLE) signal is driven high by an inverter in the AND gate 210. In this embodiment, shown in FIG. 3, WLE is asserted low by the NAND gate 310 comprising the first stage of the previous AND gate 210 alone. The load on WLE is better distributed and thus the overall operation is not only more noise-immune, but faster.

In one embodiment, static gates 302 and 308 are implemented as NOR gates that receive at one input thereof the wordline signal generated by NAND gate 310. Gates 302 and 308 receive at a second input thereof the most significant bit of the address and respectively the inverted most significant bit of the wordline address. Inverter circuit 312 inverts the logic value of the most significant bit and provides the inverted logic value of the most significant bit to NOR gate 308. This, therefore, selects the right or left cell onto the common bitline 20 shown.

Only one of the two memory cells 319 and 321 is readout at one time during readout operation, i.e., when the wordline signal on line 304 is asserted. The memory cell corresponding to the address of the wordline that is not desired to be readout is disabled by having the corresponding NOR gate asserting a 0 logic signal to the gate of the transistor coupled to the bit line 307. For example, assume that the memory cell 319 corresponding to the wordline 0 is being readout. In this case, wordline 304 is selected as the least significant bits (3:0) for the address of wordline 0.3 are all set to 0. A logic 1 signal is asserted to line 315 as it has been detected that the wordline 304 needs to be asserted. When the clock signal is at logic 1, NAND gate 310 generates at an output thereof a 0 logic signal to wordline 304. In this case NOR gate 302 corresponding to memory cell 319 receives at both input ports thereof 0 logic signals. One such signal comes from wordline 304 while the other signal comes from the most significant bit. NOR gate 302 generates at the output port thereof a logic 1 value that turns on transistor 314 permitting memory cell 319 to be readout as explained above in connection with the description of FIG. 2.

At the same time, inverter 312 inverts the most significant bit corresponding to the address of wordline 0 and generates a logic 1 at the output port of this inverter. The logic 1 is driven to one of the input ports of NOR gate 308 causing a 0 logic to be generated at the output port of this gate. The 0 logic is provided to the gate of transistor 320 that prevents readout of the memory cell 321 at the same time data is readout from memory cell 319.

Figure 4:
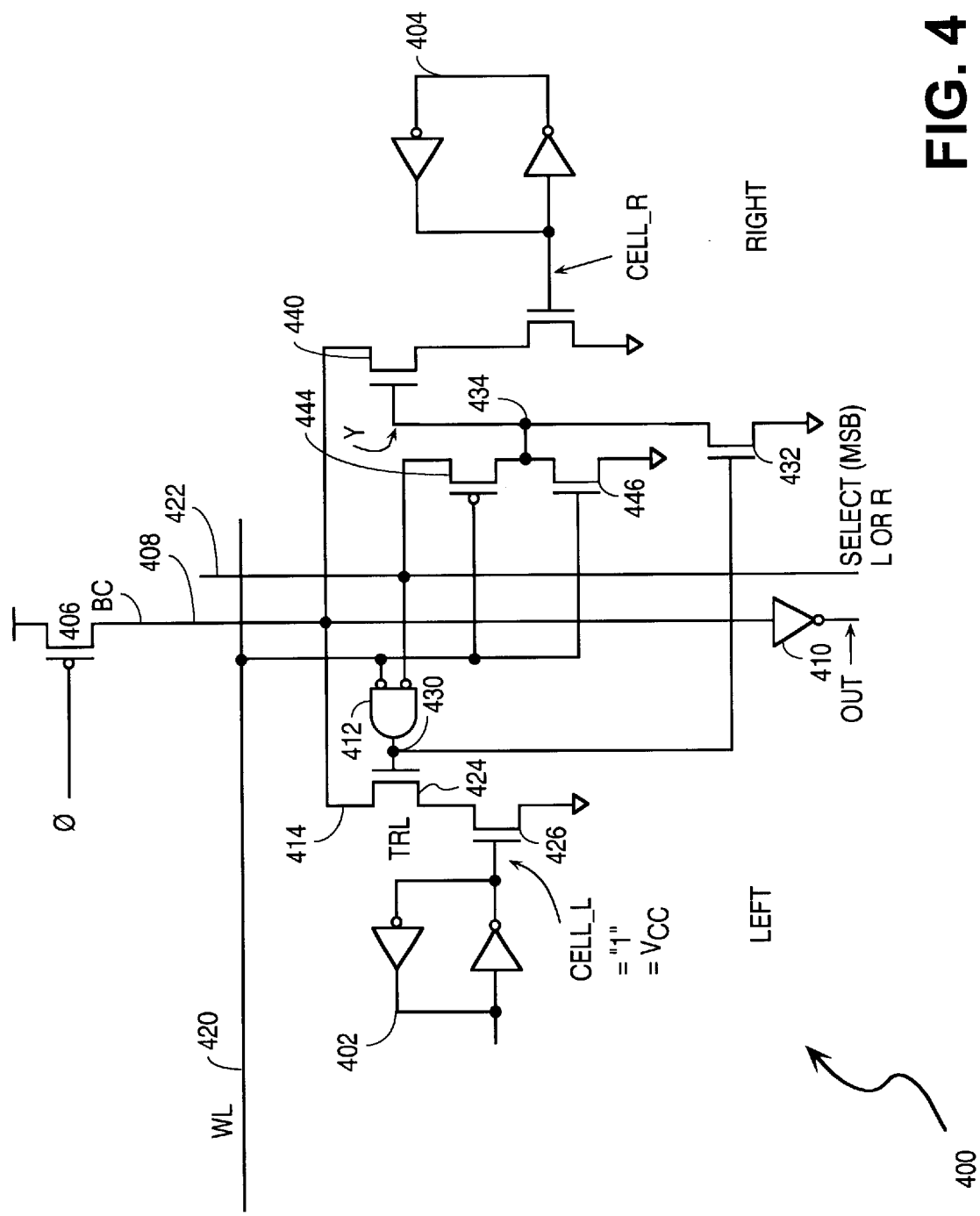
FIG. 4 illustrates an alternative embodiment of the register file shown in FIG. 3.

FIG. 4 illustrates an alternative embodiment of the register file shown in FIG. 3. For simplification purposes only one wordline and bit line of the register file 400 are shown in the figure. The circuit of FIG. 4 works in a substantially similar fashion as the circuit of FIG. 3 with the exception that one of the NOR gates associated to the right-hand side memory cell 404 has been substituted by a number of transistors to reduce the larger number of transistors otherwise required for a NOR gate. Circuit 400 includes two memory cells, 402 and 404 that in one embodiment are implemented as conventional Static Random Access Memory (SRAM) cells.

Circuit 400 works in the following way. Initially bitline 408 is pre-charged to a predetermined voltage level that may be Vcc typically, via PMOS transistor 406. Assume that it is desired to readout the voltage stored on the cell 402 shown on the left side in the figure. Wordline 420 is asserted by bringing the voltage of this line to logic zero. To select memory cell 402, select line 422 is set to a logic zero. As both inputs to NOR gate 412 are set to zero, the output of this gate is set to logic one turning on transistor 424 coupled to bitline 408. Depending on the logic value stored in memory cell 402, bitline 408 will remain at the same pre-charged voltage level or will be discharged by transistor 426 that is coupled at a gate thereof to memory cell 402. The content of memory cell 402 may be read out from the output port of inverter 410.

When memory cell 402 is read out, the circuit of FIG. 4 prevents accidental readout of the cell 404 shown on the right hand side in the figure. Assuming that cell 402 is selected, the signal at node 430 is set to 1 causing transistor 432 to turn on and pull node 434 to the ground. This causes transistor 440 to be Off.

When it is desired to readout cell 404, the select line 422 is set to logic 1. The source of transistor 444 is therefore set to logic 1 while the gate of transistor 444 is at logic 0. This turns on transistor 444 pulling node 434 high (to VCC) while transistor 446 is off. As node 434 is high transistor 440 is On permitting reading of the data stored in cell 404.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A register file comprising:
   a) a plurality of memory cells arranged such that a single word line enable signal path is coupled to word pairs formed from said memory cells;
   b) a logic circuit configured to enable separate access of each word of said word pairs.

2. The register file of claim 1 wherein each of said plurality of memory cells have first and second addresses.

3. The register file of claim 2 wherein the first and second addresses are represented by first and second sequences of bits that have first and second most significant bits.

4. The register file of claim 3, wherein corresponding bits of the first and second sequences of bits, different from the most significant bits, have identical logic values.

5. The register file of claim 1 wherein the logic circuit selects one of the word pairs for read out based on the most significant bit of an address input.

6. The register file of claim 1 wherein the logic circuit comprises a static logic gate.

7. In a microprocessor, a register file comprising:
   a) a plurality of memory cells arranged such that a single word line enable signal path is coupled to word pairs formed from said memory cells;
   b) a logic circuit configured to enable separate access of each word of said word pairs.

8. The microprocessor of claim 7 wherein each of said plurality of memory cells have first and second addresses.

9. The microprocessor of claim 8 wherein the first and second addresses are represented by first and second sequences of bits that have first and second most significant bits.

10. The microprocessor of claim 9, wherein corresponding bits of the first and second sequences of bits, different from the most significant bits, have identical logic values.

11. The microprocessor of claim 7 wherein the logic circuit selects one of the word pairs for read out based on the most significant bit of an address input.

12. The register file of claim 7 wherein the logic circuit comprises a static logic gate.

13. A method comprising:
   a) arranging a plurality of memory cells such that a single word line enable signal path is coupled to word pairs formed from said memory cells;
   b) configuring a logic circuit to enable separate access of each word of said word pairs.

14. The method of claim 13 wherein each of said plurality of memory cells have first and second addresses.

15. The method of claim 14 wherein the first and second addresses are represented by first and second sequences of bits that have first and second most significant bits.

16. The method of claim 15, wherein corresponding bits of the first and second sequences of bits, different from the most significant bits, have identical logic values.

17. The method of claim 13 further comprising selecting one of the word pairs for read out based on the most significant bit of an address input.

18. The method of claim 13 further comprising using a static logic gate as the logic circuit.

* * * * *